United States Patent
Mrad et al.

(10) Patent No.: US 11,152,340 B2
(45) Date of Patent: Oct. 19, 2021

(54) POWER MODULE HAVING A MULTILAYERED STRUCTURE WITH LIQUID COOLED BUSBAR AND METHOD FOR MANUFACTURING SAME

(71) Applicant: MITSUBISHI ELECTRIC CORPORATION, Tokyo (JP)

(72) Inventors: Roberto Mrad, Rennes (FR); Stefan Mollov, Rennes (FR); Jeffrey Ewanchuk, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 39 days.

(21) Appl. No.: 16/090,734

(22) PCT Filed: Apr. 5, 2017

(86) PCT No.: PCT/JP2017/014885
§ 371 (c)(1),
(2) Date: Oct. 2, 2018

(87) PCT Pub. No.: WO2017/203867
PCT Pub. Date: Nov. 30, 2017

(65) Prior Publication Data
US 2019/0123030 A1    Apr. 25, 2019

(30) Foreign Application Priority Data
May 24, 2016    (EP) .................................. 16171013

(51) Int. Cl.
*H01L 25/16*    (2006.01)
*H01L 23/473*    (2006.01)
(Continued)

(52) U.S. Cl.
CPC ............ *H01L 25/16* (2013.01); *H01L 21/486* (2013.01); *H01L 21/4857* (2013.01);
(Continued)

(58) Field of Classification Search
CPC ...................................................... H01L 25/16
(Continued)

(56) References Cited

U.S. PATENT DOCUMENTS

| 6,305,463 B1 | 10/2001 | Salmonson |
| 2002/0007935 A1* | 1/2002 | Marsala ................ H01L 23/473 165/80.2 |

(Continued)

FOREIGN PATENT DOCUMENTS

| JP | 2004-363568 A | 12/2004 |
| JP | 2006-303290 A | 11/2006 |

(Continued)

OTHER PUBLICATIONS

International Search Report, issued in PCT/JP2017/014885, dated Aug. 22, 2017.
(Continued)

*Primary Examiner* — Ajay Arora
(74) *Attorney, Agent, or Firm* — Birch, Stewart, Kolasch & Birch, LLP

(57) ABSTRACT

The present invention concerns a power module comprising at least one power die, the at least one power die is embedded in a multilayer structure, the multilayer structure is an assembly of at least two sub-modules, each sub-module being formed of isolation and conductor layers and the power module further comprises at least one capacitor embedded in the multilayer structure for decoupling an electric power supply to the at least one power die embedded in the multilayer structure and at least one driving circuit of the at least one power die that is disposed on a surface of the multilayer structure or embedded completely or partially in the multilayer structure.

4 Claims, 4 Drawing Sheets

(51) Int. Cl.
  *H01L 23/64* (2006.01)
  *H01L 21/48* (2006.01)
  *H05K 1/18* (2006.01)
  *H01L 23/538* (2006.01)
  *H01L 25/00* (2006.01)
  *H05K 3/46* (2006.01)
  *H05K 1/02* (2006.01)
(52) U.S. Cl.
  CPC ........ *H01L 21/4882* (2013.01); *H01L 23/473* (2013.01); *H01L 23/5383* (2013.01); *H01L 23/5386* (2013.01); *H01L 23/5389* (2013.01); *H01L 23/642* (2013.01); *H01L 23/645* (2013.01); *H01L 25/50* (2013.01); *H05K 1/185* (2013.01); *H05K 1/0231* (2013.01); *H05K 1/0233* (2013.01); *H05K 3/4602* (2013.01); *H05K 2201/10166* (2013.01)
(58) Field of Classification Search
  USPC ........................................................ 257/714
  See application file for complete search history.

(56) References Cited

U.S. PATENT DOCUMENTS

| | | | |
|---|---|---|---|
| 2002/0159276 A1* | 10/2002 | Deboy | H03K 17/0822 363/20 |
| 2003/0030533 A1* | 2/2003 | Waffenschmidt | H05K 1/165 336/200 |
| 2008/0111151 A1 | 5/2008 | Teraki et al. | |
| 2012/0147641 A1 | 6/2012 | Yamaguchi et al. | |
| 2013/0020726 A1* | 1/2013 | Kim | H01L 23/367 257/787 |
| 2014/0110820 A1 | 4/2014 | Standing et al. | |
| 2014/0111944 A1 | 4/2014 | Hara et al. | |
| 2014/0319673 A1* | 10/2014 | Zhou | H01L 23/492 257/712 |
| 2016/0128197 A1 | 5/2016 | Standing et al. | |

FOREIGN PATENT DOCUMENTS

| | | |
|---|---|---|
| JP | 2008-28163 A | 2/2008 |
| JP | 2012-129309 A | 7/2012 |
| JP | 2013-123040 A | 6/2013 |
| JP | 2014-86535 A | 5/2014 |
| WO | WO 2006/064666 A1 | 6/2006 |

OTHER PUBLICATIONS

Written Opinion of the International Searching Authority, issued in PCT/JP2017/014885, dated Aug. 22, 2017.

* cited by examiner

POWER MODULE HAVING A MULTILAYERED STRUCTURE WITH LIQUID COOLED BUSBAR AND METHOD FOR MANUFACTURING SAME

TECHNICAL FIELD

The present invention relates generally to a power module and a method for manufacturing the power module.

BACKGROUND ART

In power applications, especially for the ones with wide band gap devices, reducing the parasitic elements caused by the packaging and assembling techniques is critical in order to reduce the switching losses due to fast switching, to reduce the electromagnetic emissions and to obtain better current distribution in case of parallel connection of power modules.

SUMMARY OF INVENTION

To that end, the present invention concerns a power module comprising at least one power die, characterized in that the at least one power die is embedded in a multilayer structure, the multilayer structure is an assembly of at least two sub-modules, each sub-module being formed of isolation and conductor layers and the power module further comprises at least one capacitor embedded in the multilayer structure for decoupling an electric power supply to the at least one power die embedded in the multilayer structure and at least one driving circuit of the at least one power die that is disposed on a surface of the multilayer structure or embedded completely or partially in the multilayer structure.

Thus, the present invention increases the power density of power modules and reduces the parasitic components in order to reduce the power losses and electromagnetic emissions.

According to a particular feature, the power module further comprises an inductor embedded in the multilayer structure.

According to a particular feature, the power module further comprises a magnetic material that is embedded in the multilayer structure, disposed or moulded on a surface of the multilayer structure.

Thus, the power module is compact and has lower tolerances.

According to a particular feature, only a part of the multilayer structure comprising the at least one power die is cooled by a liquid cooled system.

According to a particular feature, the electric power supply provided to the at least one power die is provided by the liquid cooled busbar.

Thus, the size and cost of a power module can be reduced thanks to the multifunctional busbar.

The present invention concerns also a method for manufacturing a power module comprising at least one power die characterized in that the method comprises the steps of:
  obtaining plural sub-modules, each sub-module being formed of isolation and conductor layers,
  assembling the sub-modules with thermally and electrically conductive materials in order to form a multilayer structure,
  embedding in the multilayer structure at least one power die,
  embedding in the multilayer structure at least one capacitor for decoupling an electric power supply to the at least one power die
  assembling at least one driving circuit of the at least one power die on a surface of the multilayer structure.

Thus, the present invention increases the power density of power modules and reduces the parasitic components in order to reduce the power losses and electromagnetic emissions.

According to a particular feature, each sub-module is obtained by performing the successive steps of:
  forming at least a cavity of a size of a power die in a base layer,
  placing the or each power die in one cavity,
  laminating isolation and conducting layers on the base layer,
  drilling and metallizating in order to connect the at least one power die to the conducting layers,
  etching the conducting layers in order to obtain a layout,
  performing at least one laminating of additional thin isolation layers and thick conductor layers on both sides of the base layer,
  drilling and metallizating in order to connect the conductors layers and thick conductor layer,
  forming vias.

Thus, the power dies connected within the module have low parasitic inductance due to packaging.

According to a particular feature, after the assembling of the sub-modules, the at least one capacitor is placed in a hole in the assembled sub-modules.

Thus, the capacitor is placed as close as possible to the switching power devices in order to reduce the switching loop, thus, the loop inductance.

According to a particular feature, the at least one capacitor is electrically connected after the assembling of the sub-modules between a top layer of a top sub-module and a bottom layer of a bottom sub-module.

Thus, the capacitor is used as bus capacitor of the switching power stage.

The characteristics of the invention will emerge more clearly from reading of the following description of an example of embodiment, the said description being produced with reference to the accompanying drawings, among which:

DESCRIPTION OF EMBODIMENTS

Figure 1:
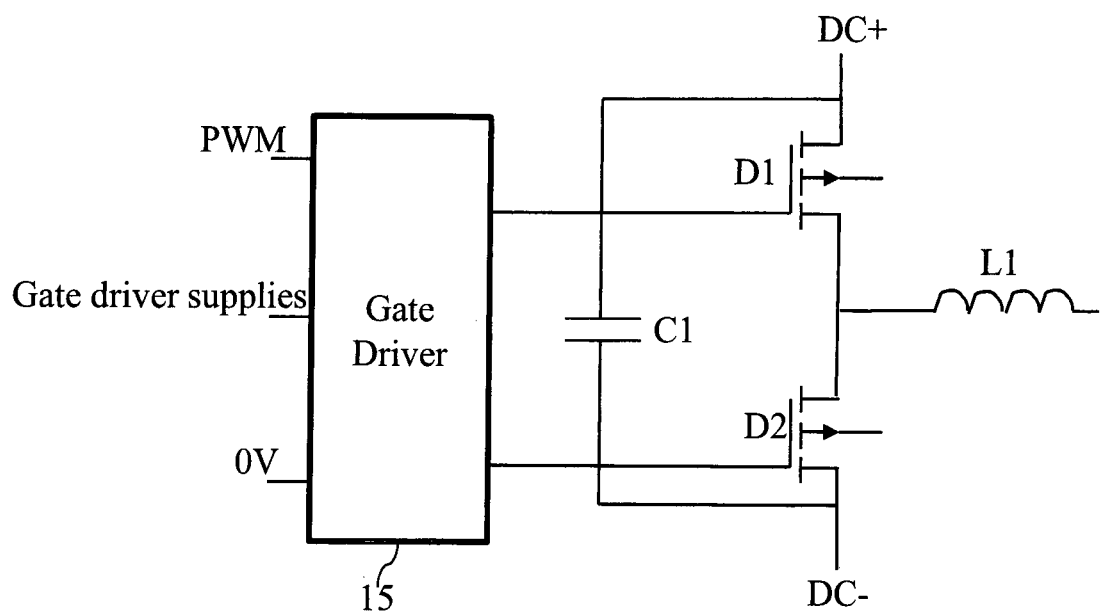
FIG. 1 is a diagram representing an example of an electric circuit of a power module according to the present invention.

FIG. 1 is a diagram representing an example of an electric circuit of a power module according to the present invention.

Each power module comprises a gate driver 15 that provides gate signals to the power dies D1 and D2.

The drain of the power die D1 is connected to the positive power supply DC+ provided, for example, by a liquid cooled busbar. The source of the power die D1 is connected to the drain of the power die D2 and to a first terminal of an inductor L1.

The source of the power die D2 is connected to the negative power supply DC− provided, for example, by the liquid cooled busbar.

The second terminal of the inductor L1 is the ouptut of the power module.

Figure 2:
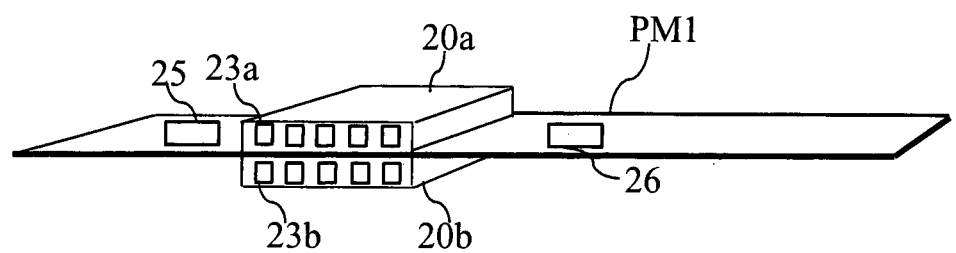
FIG. 2 is a diagram representing a power module according to the present invention that is cooled by a liquid cooled busbar.

FIG. 2 is a diagram representing a power module according to the present invention that is cooled by a liquid cooled busbar.

The power module is an assembly of plural sub-modules, for example two sub-modules which have a multilayer structure like PCBs. Each sub-module has at least one embedded semiconductor power die such as SiC MOSFET, IGBT or other. The power module assembly will be disclosed in more details in reference to FIGS. 3 and 4A to 4F.

Very close to the power dies which form the power stage of the power module, capacitors are embedded within the multilayer structure composed of the sub-modules of the power module as bus capacitors in order to smooth the bus voltage.

Each capacitor is connected between the top layer of the top sub-module and the bottom layer of the bottom sub-module. Each capacitor is electrically connected after the assembling of the sub-modules. Each capacitor is placed in a verticle hole formed by drill and is connected by soldering.

The part comprising the power dies may be cooled by a liquid cooled busbar composed of two bars 20a and 20b. The bar 20a is used to convey a negative DC power to the dies of the power module and the bar 20b is used to convey a positive DC power to the dies of the power module.

In the example of FIG. 2, each bar 20a and 20b comprises one channel that is splited to 5 sub-channels in order to increase the thermal exchange.

The channel noted 23a of the bar 20a is connected to the channel 23b of the bar 20b as other channels shown in FIG. 2.

In the multilayer structure, additional components can also be embedded like control integrated circuits noted 25, inductors, transformers, sensors, additional capacitors or resistors noted 26.

Also, embedded into the multilayer structure or mounted on the outer surface of the multilayer structure, additional components can be attached by soldering or other to include additional or complementary functionalities to the power module. The surfaces of the multilayer structure above and under the power dies are made of copper with or without finishing in order to enable the bus connections of the power modules.

Figure 3:
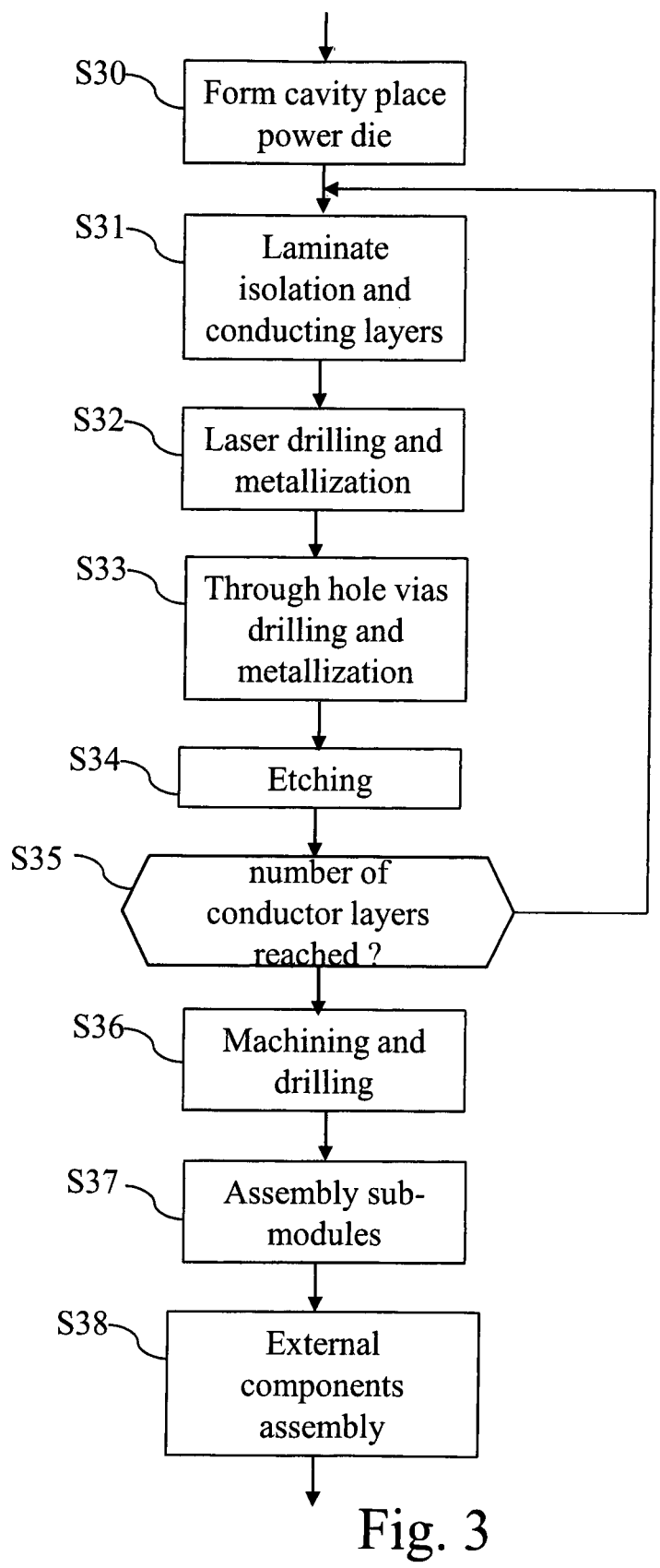
FIG. 3 is a method for manufacturing a power module according to the present invention.

FIG. 3 is a method for manufacturing a power module according to the present invention.

The power module is composed of two sub-modules which have a multilayer structure like PCBs, the differents steps of FIGS. 4A to 4F represent different stages of the manufacturing of one of the sub-modules.

At step S30, a base layer is cut, for example by laser cut in order to form a cavity of the size of a power die. The power die is then placed in the cavity. An example of the formed base layer is given in FIG. 4A.

FIGS. 4A to 4F represents different stages of the manufacturing of a power module according to the present invention.

Figure 4A:
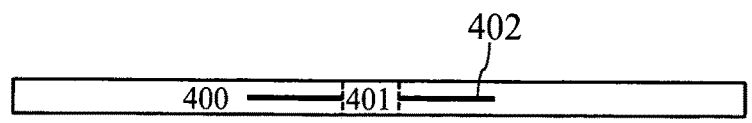
FIG. 4A represents different stage of the manufacturing of a power module according to the present invention.

The FIG. 4A represents a base layer 400 that is an electrically non-conductive and thermally conductive material. For example the base layer 400 is made of FR4. The base layer 400 is cut, for example by laser cut in order to form a cavity of the size of a power die 401. The power die 401 is then placed in the cavity. The base layer may be divided into or several layers separated by at least one higher thermally conductive layer 402 such as metal, like copper in order to increase heat spreading.

At step S31, isolation and conducting layers are laminated on the base layer formed at step S30. An example is given in FIG. 4B.

Figure 4B:
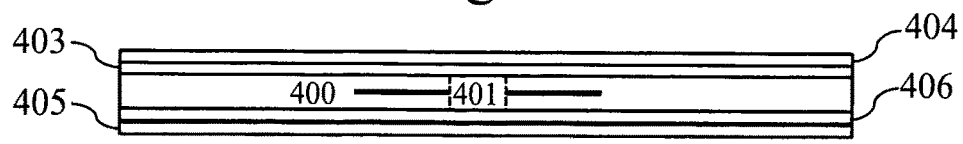
FIG. 4B represents different stage of the manufacturing of a power module according to the present invention.
Figure 4C:
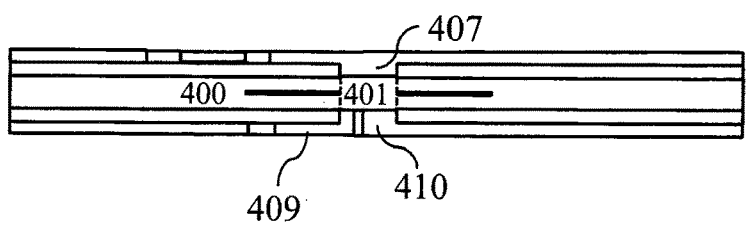
FIG. 4C represents different stage of the manufacturing of a power module according to the present invention.
Figure 4D:
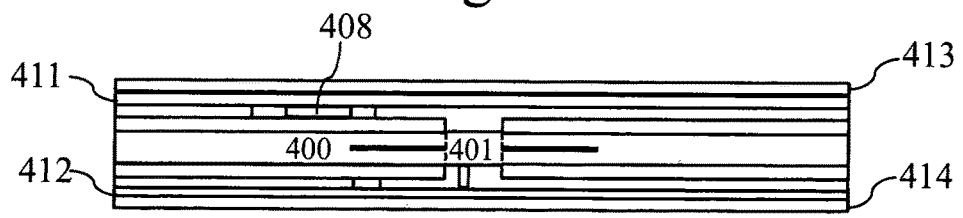
FIG. 4D represents different stage of the manufacturing of a power module according to the present invention.
Figure 4E:
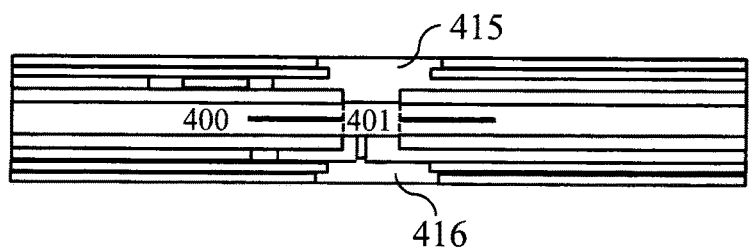
FIG. 4E represents different stage of the manufacturing of a power module according to the present invention.
Figure 4F:
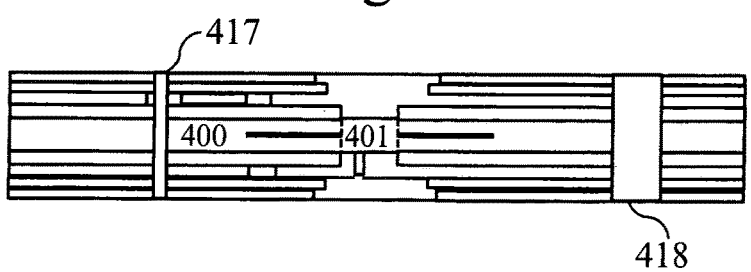
FIG. 4F represents different stage of the manufacturing of a power module according to the present invention.

The FIG. 4B represents the base layer 400 and the power die 401 on which a thin isolation layer 403 is laminated on the top of the base layer 400 and a thin isolation layer 406 is laminated on the bottom of the base layer 400. Electrically conducting layers 404 and 405, for example made of copper, are laminated also on the thin isolation layers 403 and 406. Insulation and conducting layers are laminated together in a single step.

It has to be noted here that the same operation is performed of the other sub-module.

At step S32, laser drilling and metallization are then made in order to connect the power die 401 to the conductor layer. An example is given in FIG. 4C.

Laser drilling and metallization 407, 409 and 410 are then made in order to connect the power die 401 to the conductor layer. The power die contact to the conductor layers can cover completely the power die top and bottom surface, or partially, by using multiple via connections or other shapes.

At step S33, through hole vias are mechanically drilled and a further metallization is performed in order to connect the different conductor layers at different spots according to a layout.

At step S34, the conductor layers are etched, for example by a chemical or a mechanical process in order to obtain the desired layout like for example the one noted 408 on the thin conductor layer.

At step S35, if the number of conductor layers is not reached, the process returns to step S31. Otherwise, the process moves to step S36.

FIGS. 4A to 4F are example wherein only two conductor layers are needed. According to this example, the process moves to step S31 and executes again the steps S31 to S34 one time.

Additional thin isolation layers and a thick conductor layers are laminated on both sides. An example is given in FIG. 4D.

Additional thin isolation layers 411 and 412 and thick conductor layers 413, 414 are laminated on both sides of the sub-module as obtained at step S34.

Laser drilling and metallization are then made in order to connect the thin conductors layers and the thick conductor layers. An example is given in FIG. 4E.

Laser drilling and metallization 415 and 416 are then made in order to connect the thin conductors layers 404 and 405 and the thick conductor layers 413 and 414. The connection can be made through multiple via connections or through other shapes like metalized copper squares. The conductor layers are etched in order to obtain the desired layout on layers 413 and 414 and vias are formed. An example is given in FIG. 4F.

Through hole vias 417 are made by drilling then metallizing. Also, board machining or drilling is performed in order to place capacitors 418 and magnetic materials.

Note that in some particular cases where the conductor layers 413 and 414 are very thick, they can be pre-etched before lamination.

At step S36, machining and drilling are performed in order to obtain any desired module shape or drills on the module for any mechanical features sweeted to the final application. Machining and drilling can also be made in order to assemble later on additional components such as capacitors, magnetic materials for inductors or other.

At step S37, the two sub-modules are then assembled with thermally and electrically conductive materials in order to form the multilayer structure.

At step S38, external component soldering, attachment and magnetic material moulding is performed.

Very close to the power dies which form the power stage of the power module, capacitors are embedded within the two sub-modules of the power module as bus capacitors in order to smooth the bus voltage.

Each capacitor is connected between the top layer of the top sub-module and the bottom layer of the bottom sub-module. Each capacitor is electrically connected after the assembling of the sub-modules. Each capacitor is placed in a verticle drill and is connected by soldering.

Figure 5:
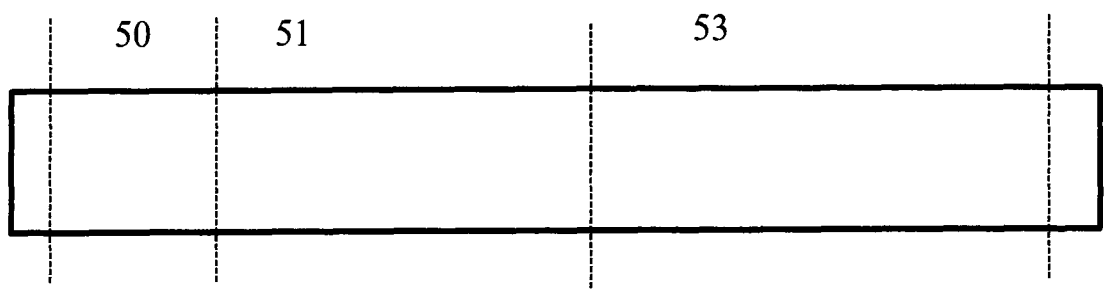
FIG. 5 represents the different areas of a power module according to the present invention.

Also, embedded into the assembled sub-modules or mounted on the outer surface of the assembled sub-modules, additional components like control integrated circuits inductors, transformers, sensors, magnetic material, additional capacitors or resistors can be attached by soldering or other on a surface of the multilayer structure to include additional or complementary functionalities to the power modules. FIG. 5 represents the different areas of a power module according to the present invention.

The power module according to the present invention is decomposed into plural areas.

In the area noted 50, gate drivers of the power dies are located.

In the area noted 51, the decoupling or bus capacitors and power dies are located and in the area noted 53, an external inductor is located.

Naturally, many modifications can be made to the embodiments of the invention described above without departing from the scope of the present invention.

The invention claimed is:

1. A power module decomposed into plural areas, comprising:
   at least one power die embedded in a multilayer structure in one of the plural areas, the multilayer structure being an assembly of an electrically non-conductive and thermally conductive base layer and at least two sub-modules, each sub-module being formed of isolation and conductor layers;
   at least one capacitor embedded, in a different one of the plural areas from the at least one power die, in the multilayer structure for decoupling an electric power supply to the at least one power die embedded in the multilayer structure, the at least one capacitor being electrically connected between a top layer of a top one of the at least two sub-modules and a bottom layer of a bottom one of the at least two sub-modules;
   at least one driving circuit of the at least one power die disposed on a surface of the multilayer structure or embedded completely or partially in the multilayer structure; and
   a liquid cooled busbar provided in the area where the at least one power die is provided to cool the at least one power die and supply electric power to the at least one power die.

2. The power module according to claim 1, wherein the power module further comprises an inductor embedded in the multilayer structure.

3. The power module according to claim 1, wherein the power module further comprises a magnetic material that is disposed on a surface of the multilayer structure or embedded completely or partially in the multilayer structure.

4. The power module according to claim 2, wherein the power module further comprises a magnetic material that is disposed on a surface of the multilayer structure or embedded completely or partially in the multilayer structure.

* * * * *